United States Patent [19]
Watanabe et al.

[11] Patent Number: 5,434,821
[45] Date of Patent: Jul. 18, 1995

[54] DYNAMIC SEMICONDUCTOR MEMORY DEVICE HAVING SENSE AMPLIFIER WITH COMPENSATED OFFSET VOLTAGE

[75] Inventors: Yohji Watanabe; Nobuo Nakamura, both of Kanagawa, Japan

[73] Assignee: Kabushiki Kaisha Toshiba, Kanagawa, Japan

[21] Appl. No.: 986,908

[22] Filed: Dec. 8, 1992

[30] Foreign Application Priority Data

Dec. 12, 1991 [JP] Japan ................................. 3-328808

[51] Int. Cl.$^6$ .............................................. G11C 7/00
[52] U.S. Cl. .................... 365/203; 365/202; 365/205; 365/207; 365/189.01; 327/52
[58] Field of Search ...................... 365/189.01, 188.05, 365/202, 203, 205, 207; 307/279, 296.5, 296.8, 530

[56] References Cited

U.S. PATENT DOCUMENTS 4,547,685 10/1985 Wong ................................. 365/208
4,954,992 9/1990 Kumanoya et al. ............ 365/189.01

FOREIGN PATENT DOCUMENTS 5979486 5/1984 Japan ................................. 365/203
1109591 4/1989 Japan ................................. 365/205

OTHER PUBLICATIONS

"Threshold Difference Compensated Sense Amplifer", S. Suzuki and M. Hirata, IEEE Journal of Solid-State Circuits, SC-14(6):1066-1069 (Dec. 1979).
"A New Sense Amplifier Technique For VLSI Dynamic Ram's", T. Furuyama, S. Saito and S. Fujii, IEDM Technical Digest, pp. 44-47, (1981).

Primary Examiner—Joseph A. Popek
Assistant Examiner—F. Niranjan
Attorney, Agent, or Firm—Finnegan, Henderson, Farabow, Garrett & Dunner

[57] ABSTRACT

A dynamic random access memory, which comprises a substrate, a dynamic memory cell located on the substrate, a pair of bit lines to read out data from the cell and/or write data to the cell, a plurality of word lines, connected to the bit lines, to select a desired memory cell, a differential sense amplifier having an output line, the differential sense amplifier amplifying data from the pair of bit lines and transferring the amplified data to the output lines; means for precharging a first bit line of the pair of bit lines to a reference voltage and a second bit line of the pair of bit lines to a second voltage exceeding the reference voltage by the amount of an input offset voltage of the sense amplifier.

21 Claims, 19 Drawing Sheets

DYNAMIC SEMICONDUCTOR MEMORY DEVICE HAVING SENSE AMPLIFIER WITH COMPENSATED OFFSET VOLTAGE

BACKGROUND OF THE INVENTION

1. Field of the Invention

The present invention relates to a semiconductor memory device, such as a dynamic random access memory (DRAM) and particularly to a dynamic RAM having an improved bit-line sense amplifier.

2. Description of the Related Art

A semiconductor memory device, such as a dynamic RAM, comprising memory cell arrays of, for example, one transistor and one capacitor, provides a sense amplifier (S/A) to amplify data from a bit line and transfer the amplified data to an output line. Data of each memory cell is read out through bit lines. However, the capacity of the bit lines is larger than that of the memory cell, so the sense amplifier must be highly sensitive to detect the data of "H" or "L".

A structure of a conventional bit line sense amplifier circuit 4 using a gate input type sense amplifier (S/A) 6 is shown in FIGS. 1(a) and 1(b). As shown in FIG. 1(a), a pair of bit lines BL,/BL is precharged to a voltage of ($\frac{1}{2}$) Vcc by a ($\frac{1}{2}$) Vcc generator 8 during a precharge operation and a sensing operation is set to be in a floating state. The sense amplifier 6 has at least two transistors and a bit line voltage is applied to a gate of respective ones of the transistors.

After these operations, a reading out operation is carried out by selecting a desired word line as shown in FIG. 1(b).

FIG. 2 shows a timing chart of each signal in the conventional bit line sense operation explained above. When a control signal /RAS is at an "H" level, (i.e., in a state of precharge), a switch EQ1 in FIG. 1(a) is turned on "ON" and a pair of bit lines BL,/BL is precharged to ($\frac{1}{2}$) Vcc. The signal /RAS is provided as a row address strobe signal. Data of a selected memory cell (MC) is read out to bit line BL, by setting a word line (WL), which is connected to a gate of the selected memory cell, to be "H" level. A change in potential of a pair of bit lines BL,/BL is sensed by the sense amplifier 6 and is read out to output lines OUT,/OUT.

The sense amplified 6, which receives a bit line voltage at the gate of the transistor in the sense amplifier, cannot amplify the bit line voltage by itself, so a flip-flop (F/F) type sense amplifier is attached in parallel.

However, in the conventional structure of the sense amplifier circuit, which uses conventional operational timing, when a pair of bit lines BL,/BL is precharged to ($\frac{1}{2}$) Vcc, if a pair of transistors of the sense amplifier circuit has an imbalance in a threshold voltage or a channel conductance, the ability of the sense amplifier circuit to amplify decreases and either a time for reading out data of a bit line increases or an error signal is output. Also, when such an imbalance occurs, more deviations in read out time occur among the sense amplifier circuits in the memory device.

Thus, conventional sense amplifier circuits have a problem in that they generate an input-offset voltage by the imbalance of the threshold voltage or channel conductance of the pair of transistors in the sense amplifier. This imbalance decreases the performance quality of the sense amplifier circuit.

SUMMARY OF THE INVENTION

The object of the invention is to provide a DRAM having a high performance sense amplifier, which improves an effect of an input offset voltage.

To achieve the object of the invention, there is provided a DRAM which comprises: a substrate; dynamic memory cell located on the substrate; a pair of bit lines to read out data from the cell and/or write data to the cell; word lines, coupled to the bit lines, to select a desired memory cell; a differential sense amplifier having an output line, the differential sense amplifier amplifying data from the pair of bit lines and transferring the amplified data to output line; and means for precharging a first bit line of the pair of bit lines to a reference voltage and a second bit line of the pair of bit lines to a second voltage exceeding the reference voltage by the amount of an input offset voltage of the sense amplifier.

BRIEF DESCRIPTION OF THE DRAWINGS

Other objects and advantages of the invention will be apparent from the following description, taken in conjunction with the accompanying drawings, in which.

DETAILED DESCRIPTION OF THE PREFERRED EMBODIMENTS

In the embodiments of the invention described below, semiconductor memories have a sense amplifier, which compensates for an input offset voltage.

Figure 1A:
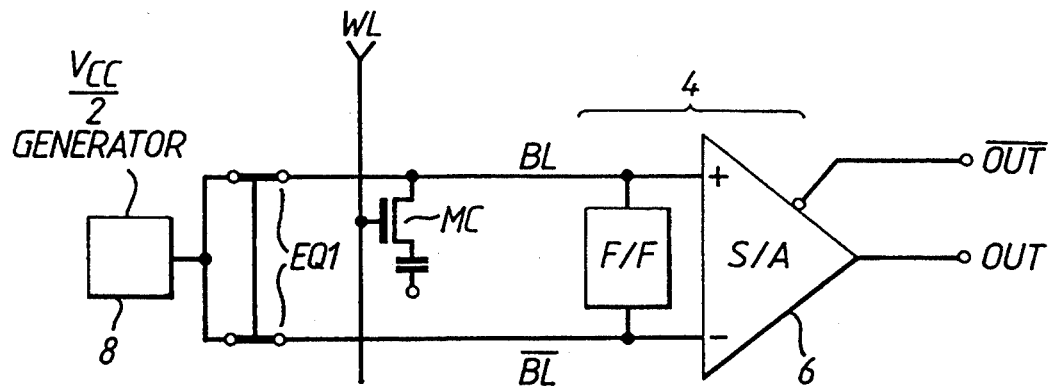
FIGS. 1(a) and 1(b) are schematic circuit diagrams of a conventional sense amplifier.
Figure 1B:
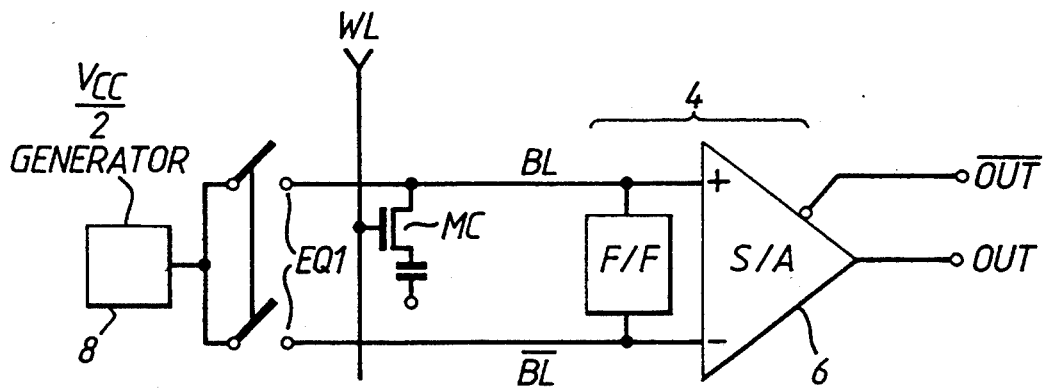
Figure 2:
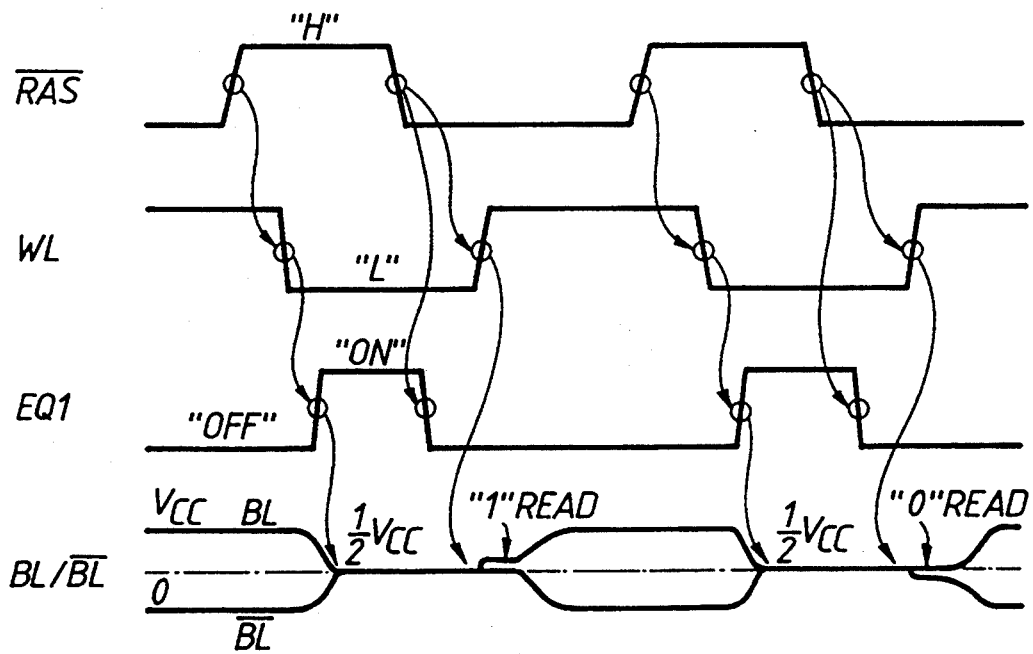
FIG. 2 shows a timing chart of the conventional sense amplifier.
Figure 3:
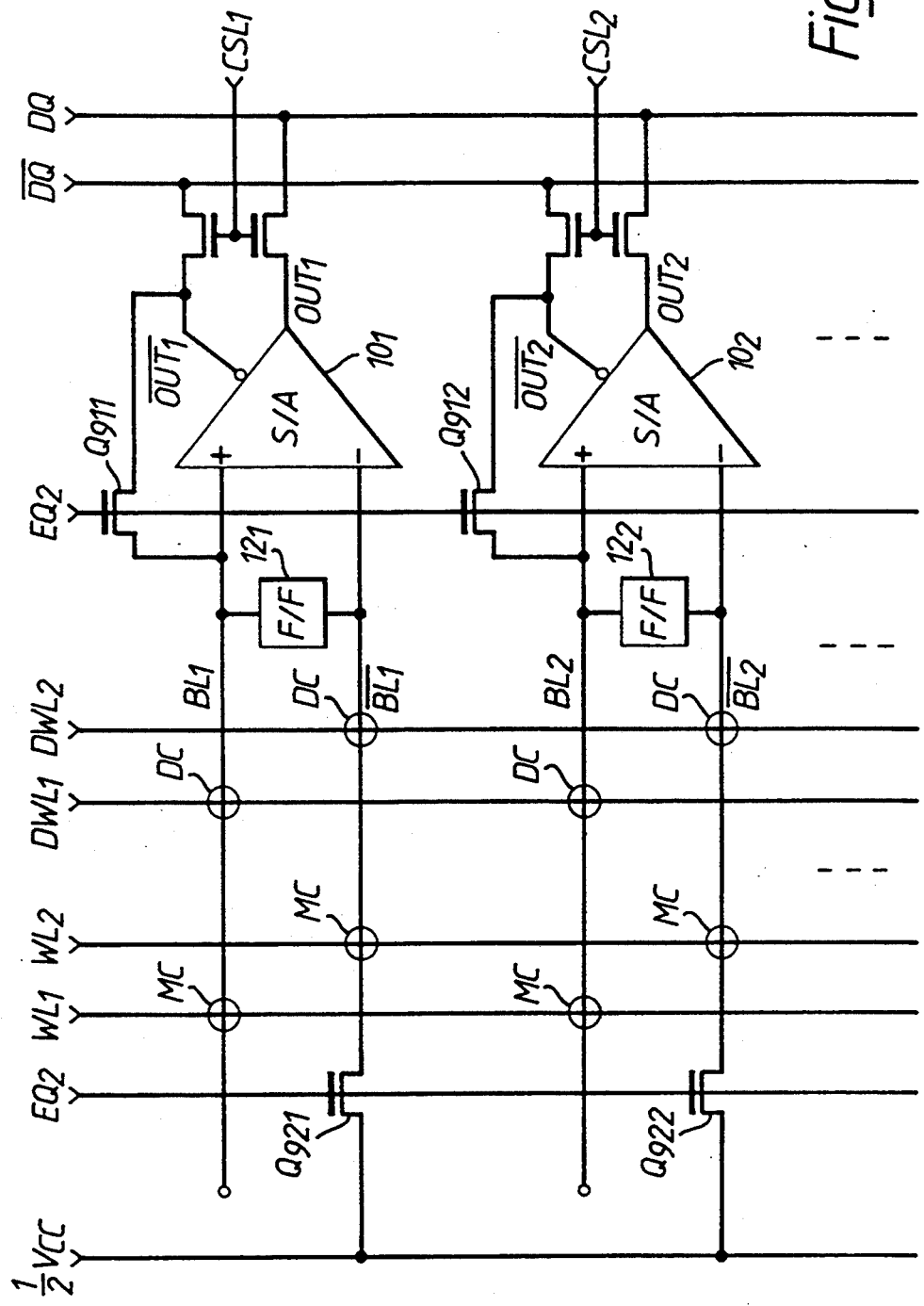
FIG. 3 shows a schematic circuit diagram of a first embodiment of the invention.

FIG. 3 shows a schematic circuit diagram of a dynamic random access memory (DRAM) according to the first embodiment. A differential amplifier type of sense amplifier 10 (10$_1$, 10$_2$ . . . ) is connected to a pair of bit lines BL,/BL, and each of bit lines BL,/BL is connected to a corresponding memory cell (MC) array, as shown in FIG. 3. In a first embodiment, one end of bit line BL (BL$_1$, BL$_2$ . . . ) is connected to a noninverted input terminal of sense amplifier 10 (10$_1$, 10$_2$ . . . ) and one end of bit line /BL is connected to an inverted input terminal of sense amplifier 10.

A precharge means (not shown in the figure) is provided to connect to another end of bit line /BL, through an NMOS transistor Q91 (Q921, Q922 . . . ). Bit line /BL is precharged to a reference voltage, such as ($\frac{1}{2}$) Vcc by the precharge means. An NMOS transistor Q91 (Q911, Q912, . . . ) is provided between bit line BL and an inverted output /OUT (/OUT$_1$,/OUT$_2$ . . . ) terminal. A reference voltage from the inverted output /OUT is fed back to bit line (BL) as a reference voltage.

A flip-flop circuit 12 (12$_1$, 12$_2$ . . . ) is provided between bit lines BL and /BL for restoring data.

Figure 4:
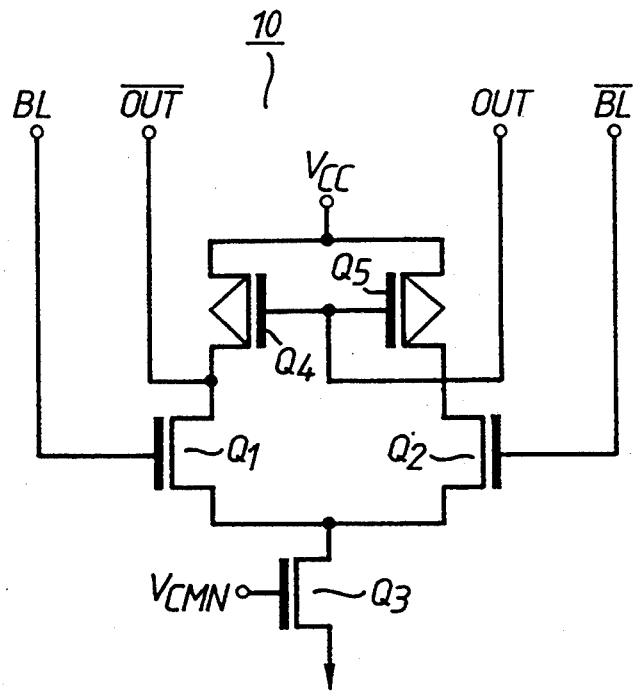
FIG. 4 is a circuit diagram of a differential sense amplifier used in the first embodiment.

FIG. 4 is a schematic circuit diagram of an example of differential amplifier type sense amplifier 10 of FIG. 3.

This is a current-mirror type differential sense amplifier, which comprises NMOS driver transistors Q1, Q2, a NMOS current source transistor Q3, and PMOS transistors Q4, Q5 functioning as an active load.

Figure 5:
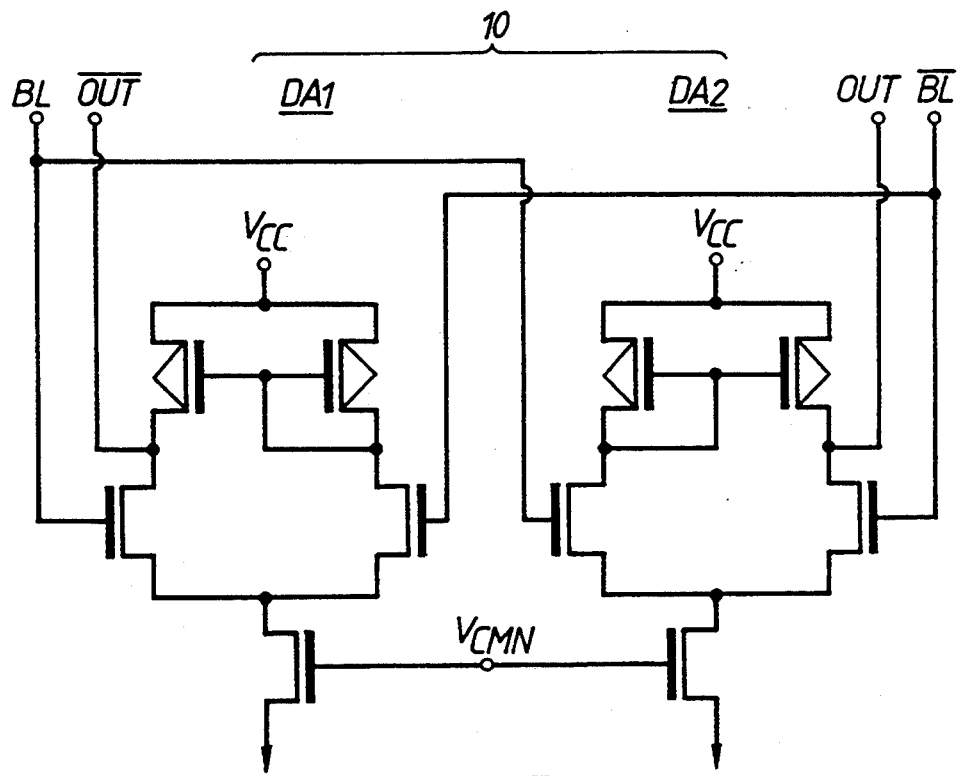
FIG. 5 and FIG. 6 show other sense amplifiers, applicable in the first embodiment.
Figure 6:
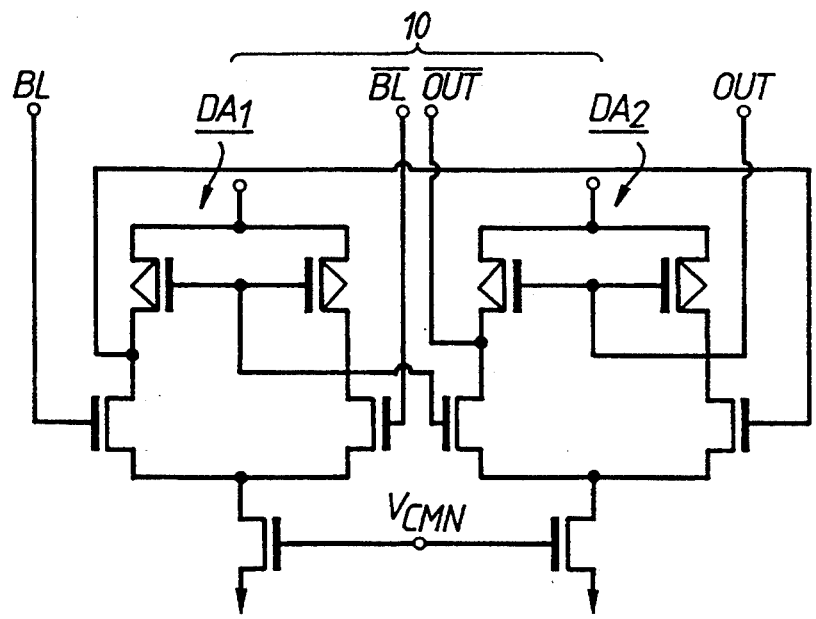

Other sense amplifiers, such as those shown in FIG. 5 and FIG. 6 can also be used in the first embodiment. For example, the sense amplifier shown in FIG. 5, in which two current mirror type sense amplifiers DA1, DA2 are connected in parallel in order to increase the voltage amplitude of output OUT, can be substituted for the sense amplifier of FIG. 4. The sense amplifier of FIG. 5 can obtain more voltage gain than the sense amplifier of FIG. 4, which has just one current mirror.

FIG. 6 shows another sense amplifier having two current mirror type sense amplifiers DA1, DA2. These amplifiers DA1, DA2 are directly connected in order to increase the amplification gain of the sense amplifier. By using this sense amplifier shown as in FIG. 6, more effective compensation for the input offset voltage can be obtained.

Figure 7A:
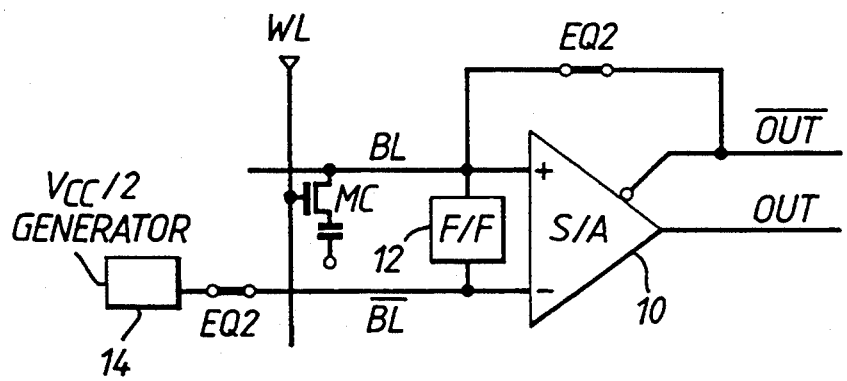
FIGS. 7(a) and 7(b) are the circuit diagrams, which explain an operation of the first embodiment.

The operation of a DRAM according to the first embodiment is explained below using schematic circuit diagrams, shown in FIG. 7(a) and FIG. 7(b). In a precharge operation for bit lines BL,/BL, bit line /BL is precharged at a potential of ($\frac{1}{2}$) Vcc, which is applied by a bit line reference voltage generator 14, such as that shown in FIG. 7(a). Inverted output/OUT is fed back to bit line BL by setting a bit line precharge signal EQ2 to "H" level. A voltage of the bit line BL is ($\frac{1}{2}$) Vcc+δV, provided that an input offset voltage of the sense amplifier (S/A) 10 is given as δV. δV is defined by a difference between an ideal voltage (or a predetermined voltage) and a voltage, actually applied to bit lines. However, the value of δV in the embodiment may include some reasonable error.

Figure 7B:
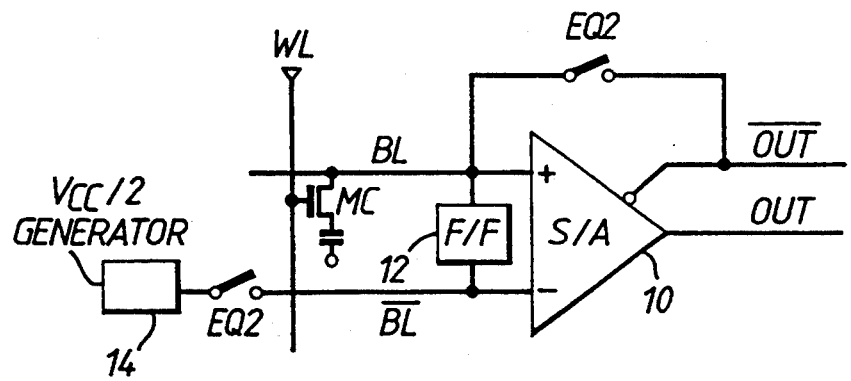

After this, as shown in FIG. 7(b), pair of bit lines BL,/BL is set to be in a floating state and a word line (WL) is set to "H" level to start a sensing operation.

Figure 8:
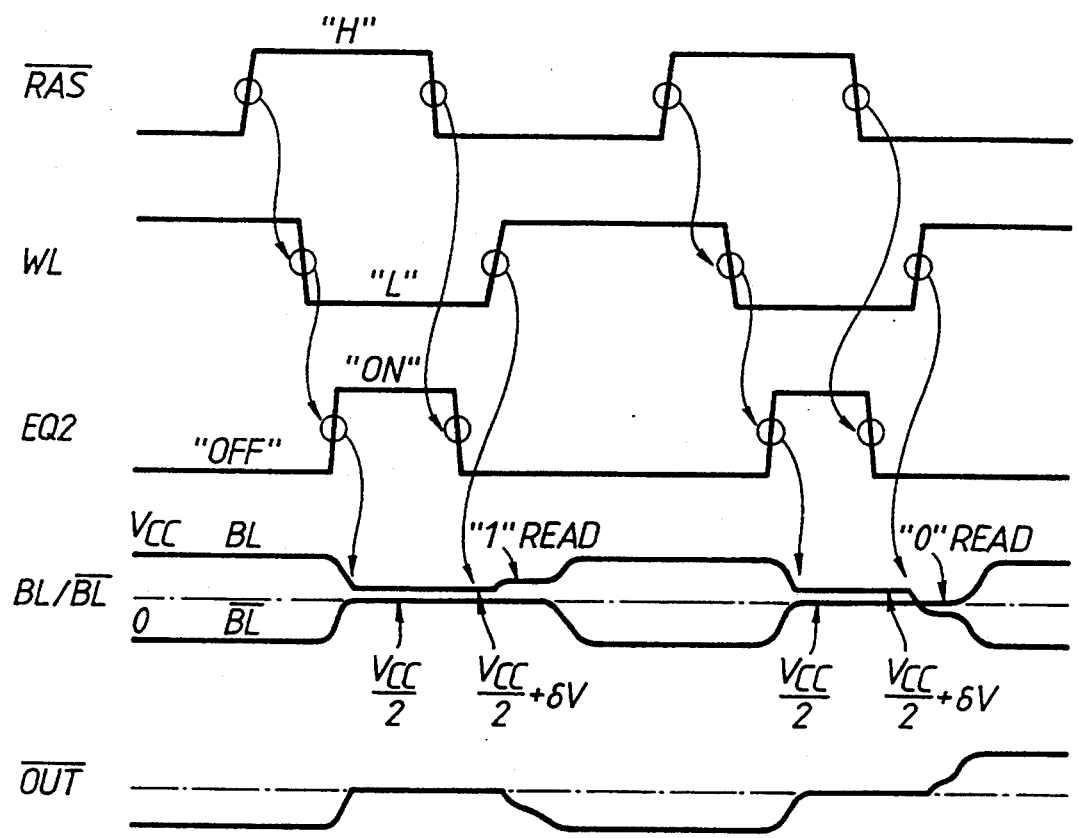
FIG. 8 shows a timing chart to explain the first embodiment.

FIG. 8 shows a timing chart for the first embodiment. When a row address strobe signal /RAS is set to be "H" level in the precharge operation, bit lines /BL, BL are respectively precharged to ($\frac{1}{2}$) Vcc and ($\frac{1}{2}$) Vcc+δV, by setting a precharge signal EQ2 to "H" level. Next, EQ2 is set to "L" level and WL is set to "H" level, by setting the signal /RAS to "L" level. In this way, data in a cell (signal) is read out to bit lines BL,/BL and a sensing operation is started. The signal /OUT is substantially the opposite of the signal BL. However, the center line of the /OUT signal does not always represent $\frac{1}{2}$ Vcc.

Figure 9:
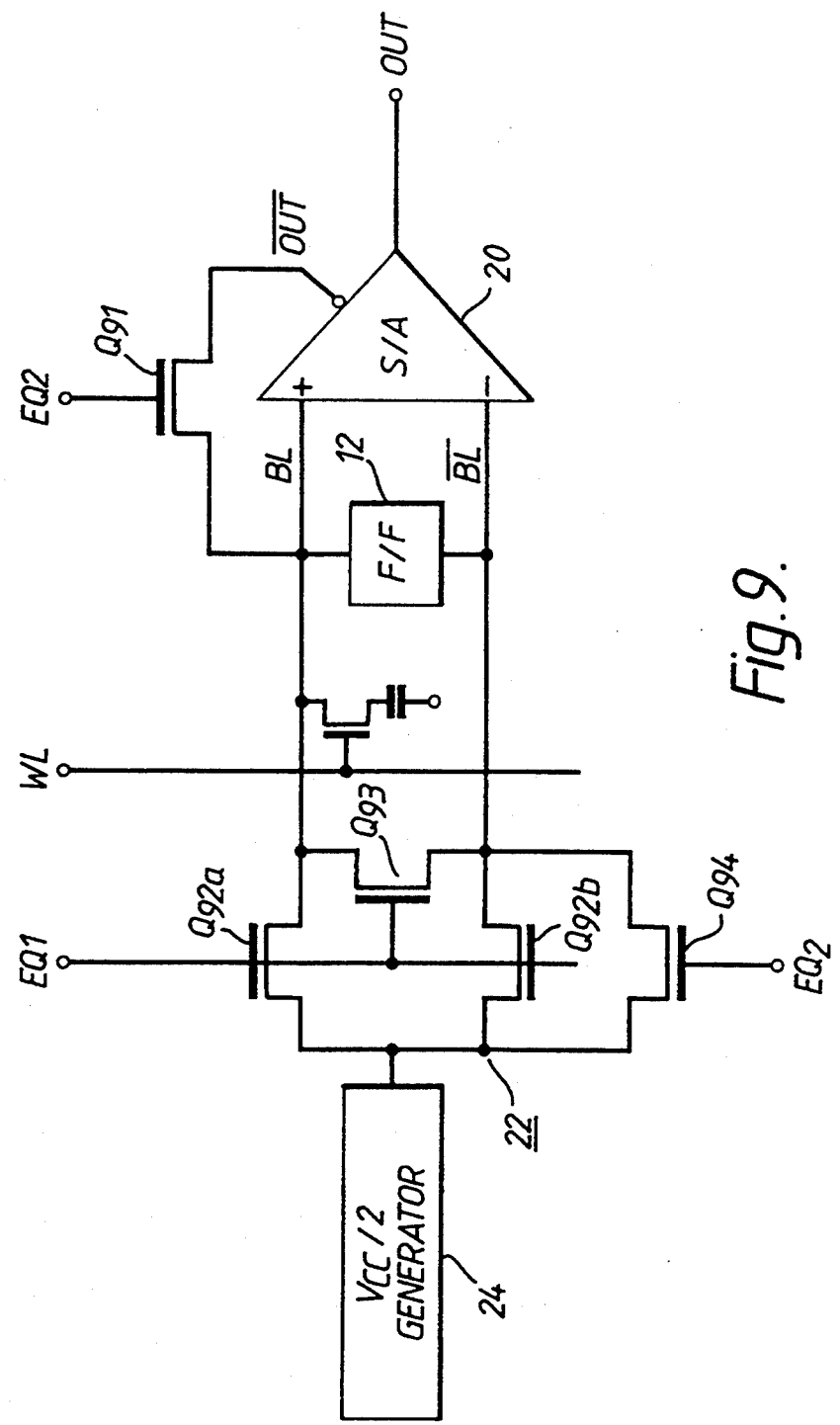
FIG. 9, FIG. 11, FIG. 12 shows modifications of the first embodiment.

FIG. 9 shows a schematic circuit diagram of a first modification of the first embodiment. In the first embodiment, only bit line /BL is precharged by the ($\frac{1}{2}$) Vcc generator 14, while in the modification both of bit lines BL and /BL are similarly precharged by ($\frac{1}{2}$) Vcc generator 24.

The precharge is carried out through a precharge/equalize circuit 22 comprising transistors Q92a, Q92b, and Q93. A transistor Q91 performs an input offset compensation on an inverted output/OUT from a sense amplifier (S/A) 20, which is fed back to bit line BL. An NMOS transistor Q94, which is simultaneously controlled with the transistor Q91 by signal EQ2, is also provided between the ($\frac{1}{2}$) Vcc generator 24 and bit line /BL.

In the precharge operation for bit lines BL,/BL, the equalizing for the bit lines is controlled by a control signal EQ1 and the precharging for bit line BL is controlled by a control signal EQ2, which is followed by the control signal EQ1. Therefore, charges of a pair of bit lines BL,/BL having values of Vcc and 0V (zero volts) for rewriting data, can be effectively used in ($\frac{1}{2}$) Vcc precharging of bit lines without any waste and low power consumption can be achieved.

Figure 10:
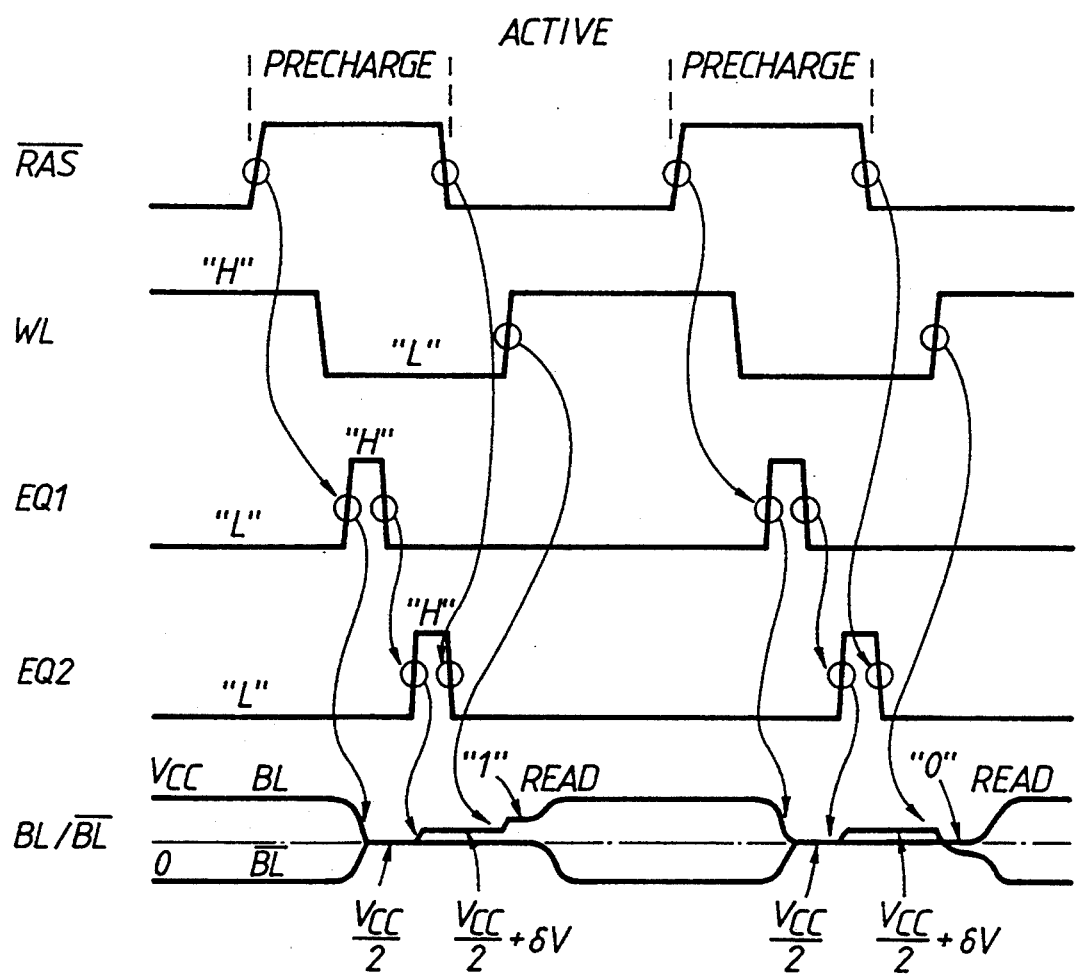
FIG. 10 is a timing chart explaining the modification shown in FIG. 9.

FIG. 10 is a timing chart of the first modification shown in FIG. 9. After /RAS rises to "H" level (in the precharge operation) and turns off word line WL, bit line equalizing signal EQ1 is set to "H" level. After the pair of bit lines BL,/BL are equalized to a voltage of ($\frac{1}{2}$) Vcc, the signal EQ1 is set to "L" level and an equalizing signal EQ2 successively is set to "H" level. At the time, bit lines /BL,BL are precharged to ($\frac{1}{2}$) Vcc and ($\frac{1}{2}$) Vcc+δV, respectively, a falling edge of the signal /RAS, causes the signal EQ2 is set to "L" level and the word line WL is set to "H" level so as to start a reading out operation.

Figure 11:
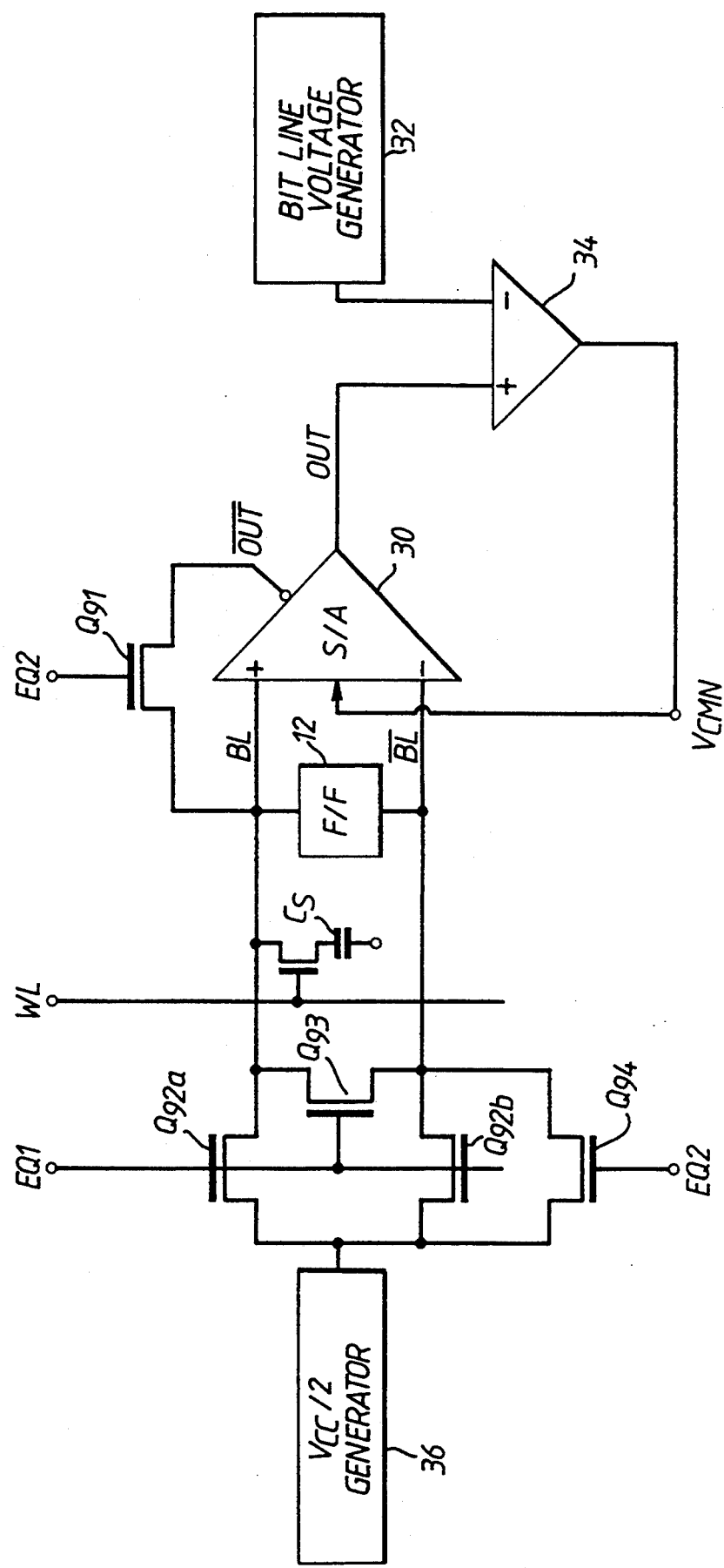

FIG. 11 is a schematic circuit diagram of a second modification of the first embodiment. In the second modification, a bit line voltage generator 32 and a differential amplifier 34 control a control voltage V$_{CMN}$ of a current source transistor in the sense amplifier (e.g., transistor Q3 of FIG. 4), such that a center of voltage amplitude in output/OUT of sense amplifier 30 coincides with a bit line voltage as a reference voltage, e.g., a precharge voltage ($\frac{1}{2}$) Vcc of bit line /BL. The precharge voltage is applied by a ($\frac{1}{2}$) Vcc generator 36.

Differential amplifier 34 controls a current source of sense amplifier 30 by comparing an output from bit line voltage generator 32 with an output from noninverted output OUT and by subtracting the difference between the outputs. Thus, differential amplifier 34 compensates an input offset voltage δV of sense amplifier 30 more effectively.

Figure 12:
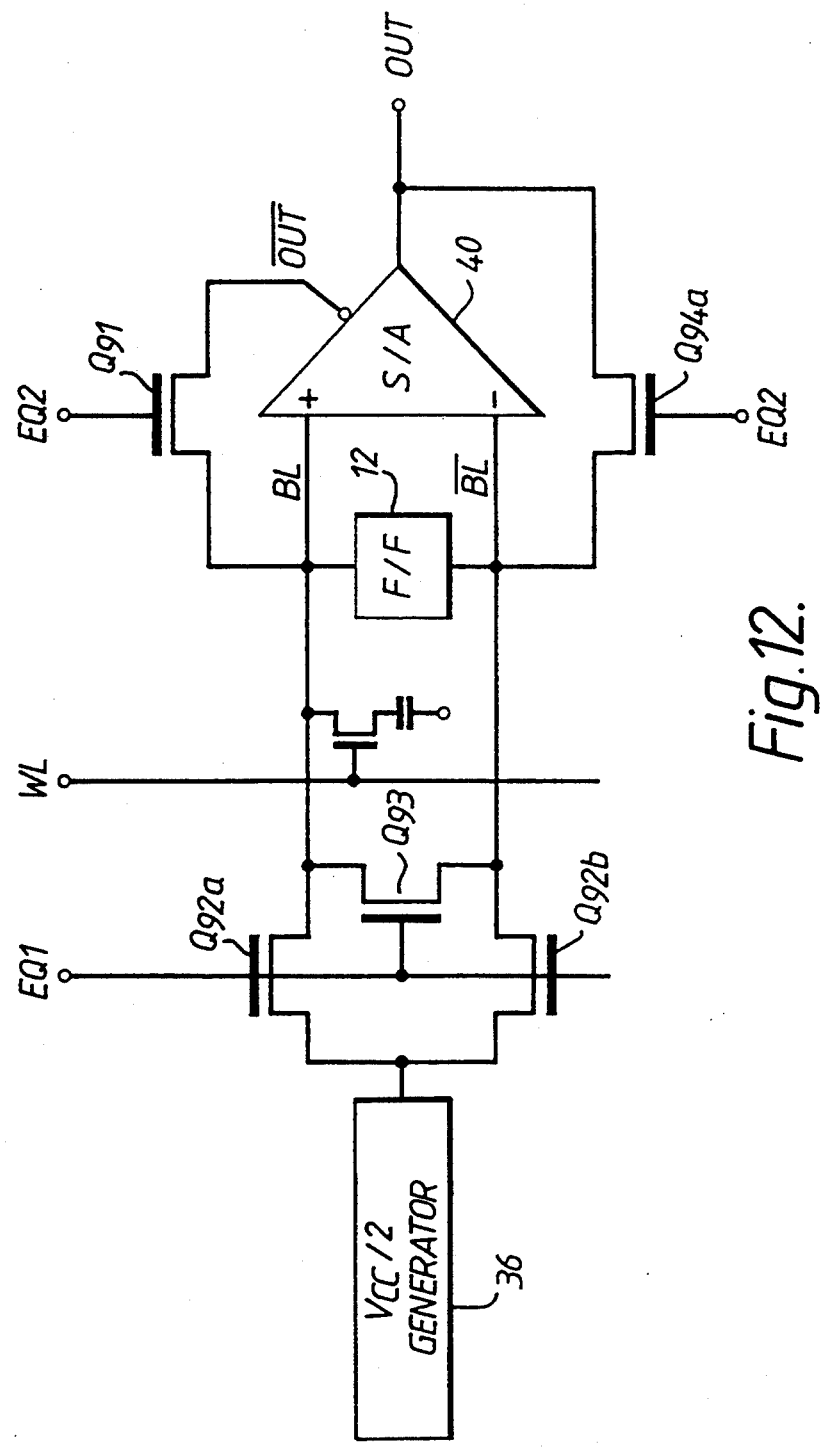

FIG. 12 shows a schematic circuit diagram of a third modification of the invention. This third modification is similar to the first modification explained above with regard to FIG. 9, however, in the third modification, transistor Q94a is provided between an output OUT from a sense amplifier 40 and a bit line /BL. In the third modification, a voltage of bit line /BL coincides with a center of voltage amplitude in output /OUT from sense amplifier 40. In the third modification, an input offset voltage δV from sense amplifier 40 is also effectively compensated.

Figure 13A:
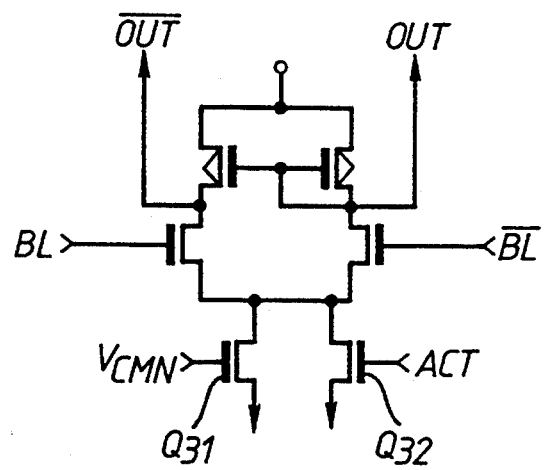
FIG. 13(a) and FIG. 14(a) are circuit diagrams explaining first and second modifications of a differential sense amplifier.
Figure 13B:
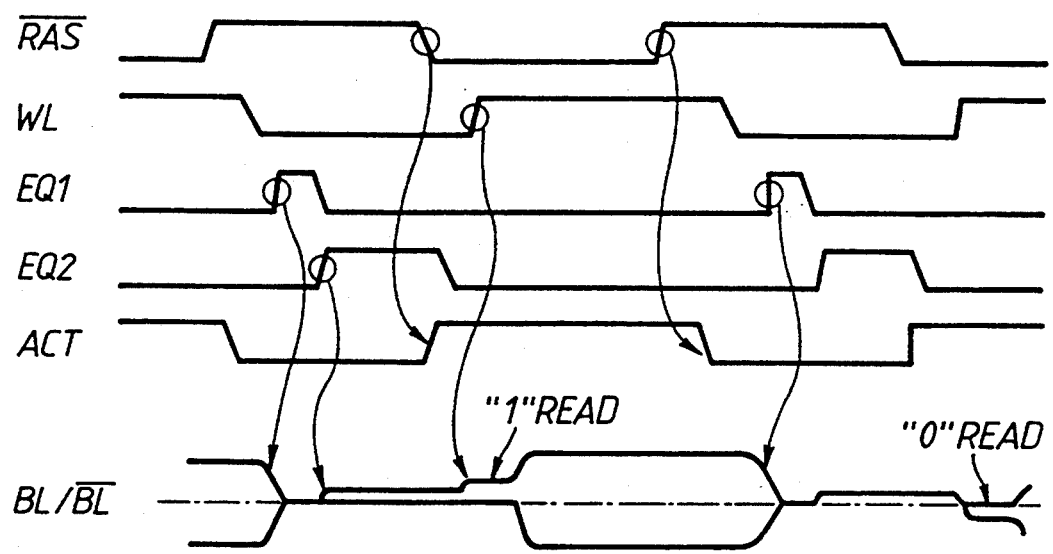
FIG. 13(b) and FIG. 14(b) show timing charts explaining operations of the first and second modification, as shown in FIG. 13(a) and FIG. 14(a).

FIG. 13(a) shows a circuit diagram of another differential sense amplifier that can be used in the embodiments described above. FIG. 13(b) shows a timing chart for the differential sense amplifier of FIG. 13(a). In the modification, two MOS transistors Q31, Q32 are provided as a current source circuit of the differential amplifier. One transistor Q31 has a narrow gate width, and the other transistor Q32 has a wider gate than that of Q31. A constant voltage $V_{CMN}$ is always applied to a gate of MOS transistor Q31. A gate of MOS transistor Q32 is controlled by a clock signal ACT, as shown in FIG. 13(b). When the DRAM operates, e.g., when /RAS goes to the "L" level, consumption of electricity during the waiting operation is suppressed minimumly by selectively increasing currents of the sense amplifier and a high speed operation during active mode can be realized.

Figure 14A:
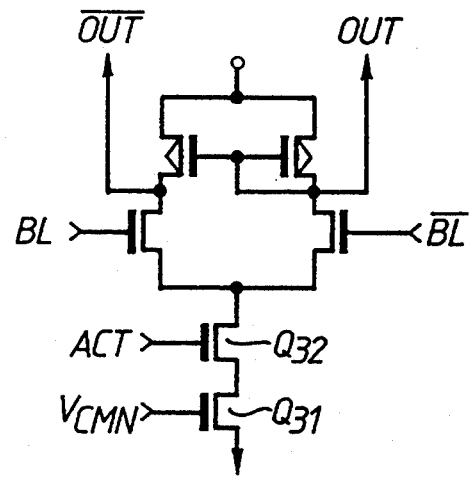
Figure 14B:
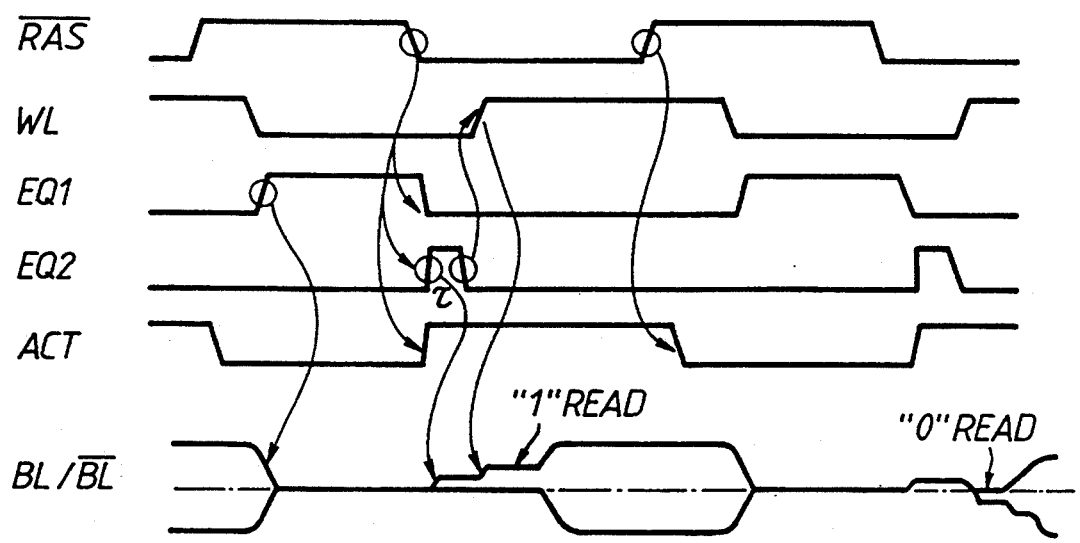

FIGS. 14(a) and 14(b) show a circuit diagram of another differential sense amplifier that can be used in the embodiments described above and a timing chart, respectively.

As shown in FIG. 14(a), a MOS transistor Q32 is controlled by a clock signal ACT, and is directly connected to a MOS transistor Q31 through its source drain. In structure, the differential sense amplifier is completely controlled by the clock signal ACT.

As shown in FIG. 14(b), in the state of waiting, e.g., when /RAS is at the "H" level, signal ACT is set to "L" level, such that a current into the sense amplifier is set to zero. During the time, pair of bit lines BL,/BL are equalized to a precharge level $V_{BL}$ by a signal EQ1. At a falling edge of /RAS, equalizing is stopped by setting a signal EQ1 to "L" level. Next, a signal EQ2 and a signal ACT are set to "H" level to start a compensation operation. After a predetermined time τ, the signal EQ2 is set to "L" level so that the pair of bit lines BL,/BL is placed in an electrically floating state and a word line WL is set to "H" level. In the modification, no current passes through the sense amplifier during the waiting operation.

Figure 15:
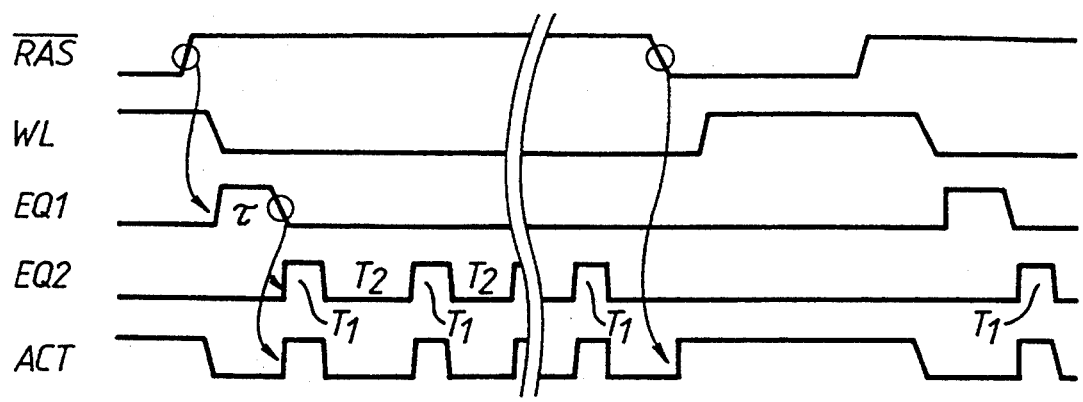
FIG. 15 shows a timing chart for the third modification of a differential sense amplifier.

FIG. 15 is another timing chart, when the sense amplifier shown in FIG. 14(a), is used. As shown in the figure, a constant periodic clocking of signal ACT is input to a gate of transistor Q32 in FIG. 14(a). If an "ON" period (T1) is designed to be shorter enough than an OFF period (T2), electricity consumption during waiting period can be largely reduced.

Figure 16A:
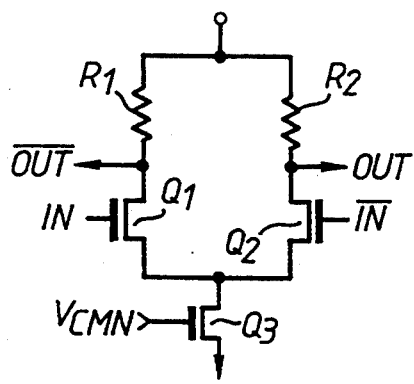
FIGS. 16(a), 16(b), and 16(c) show other differential sense amplifiers.
Figure 16B:
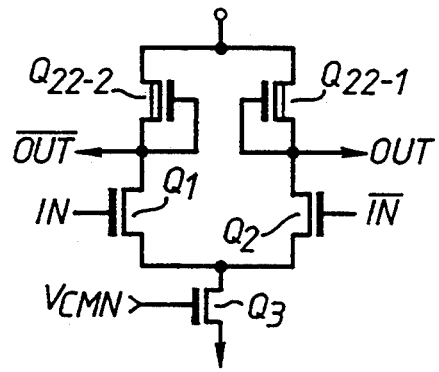
Figure 16C:
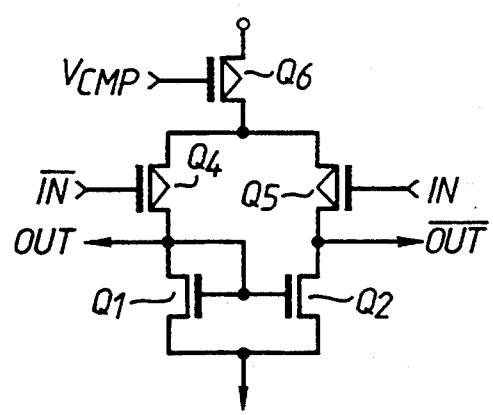

FIGS. 16(a), 16(b), and 16(c) show other modifications of a differential sense amplifier that can be used as a sense amplifier, in, e.g., the circuit of FIG. 4.

FIG. 16(a) shows a differential sense amplifier which uses resistive loads $R_1$, $R_2$. FIG. 16(b) shows a differential sense amplifier which uses D type NMOS transistors $Q22_1$, $Q22_2$ as a load. And FIG. 16(c) shows a differential sense amplifier, which comprises a current mirror type sense amplifier by using NMOS transistor Q1, Q2 as an active load, PMOS transistors Q4, Q5 as a driver, and PMOS current source transistor Q6.

Figure 17:
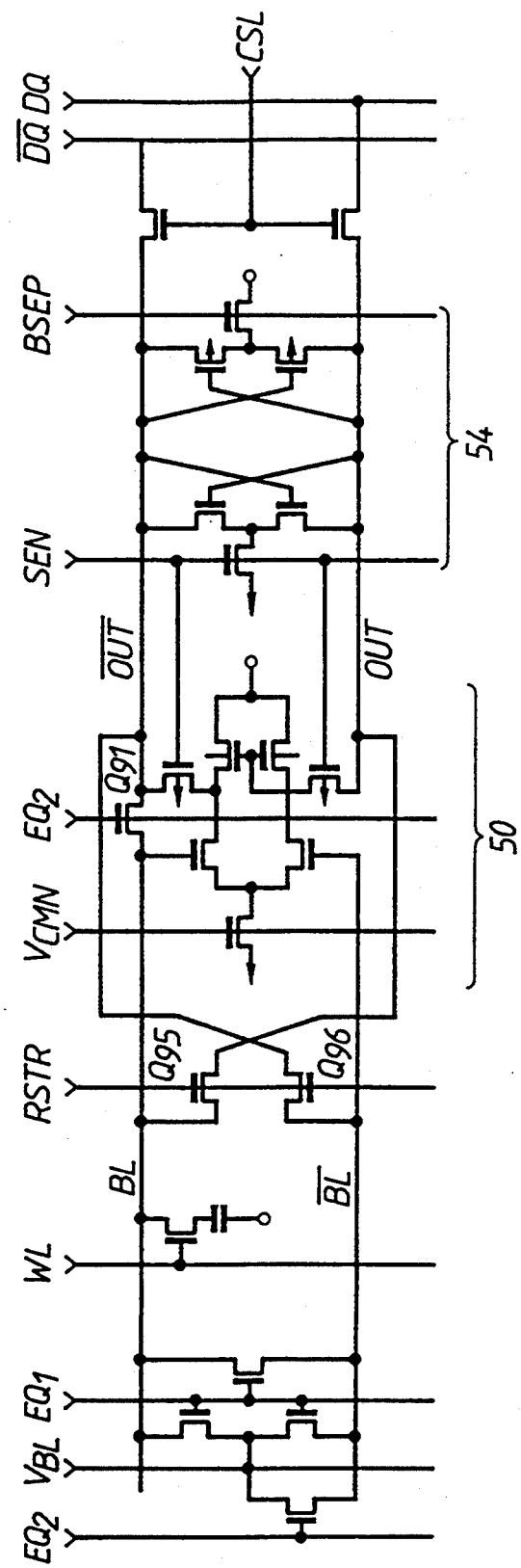
FIGS. 17 and 19 show circuit diagrams of a fourth and a fifth modification of the first embodiment.

FIG. 17 shows a schematic circuit diagram of a fourth modification of the first embodiment of FIG. 9. The fourth modification, instead of using flip-flop 22 as in FIG. 9, uses a flip-flop type sense amplifier 54 for restoring data. Sense amplifier 54 is provided at the side of an output terminal of differential sense amplifier 50. NMOS transistors Q95, Q96 to selectively connect output OUT,/OUT to each bit lines BL,/BL are also provided, so as to rewrite data by using the inverted sense amplifier output.

Figure 18:
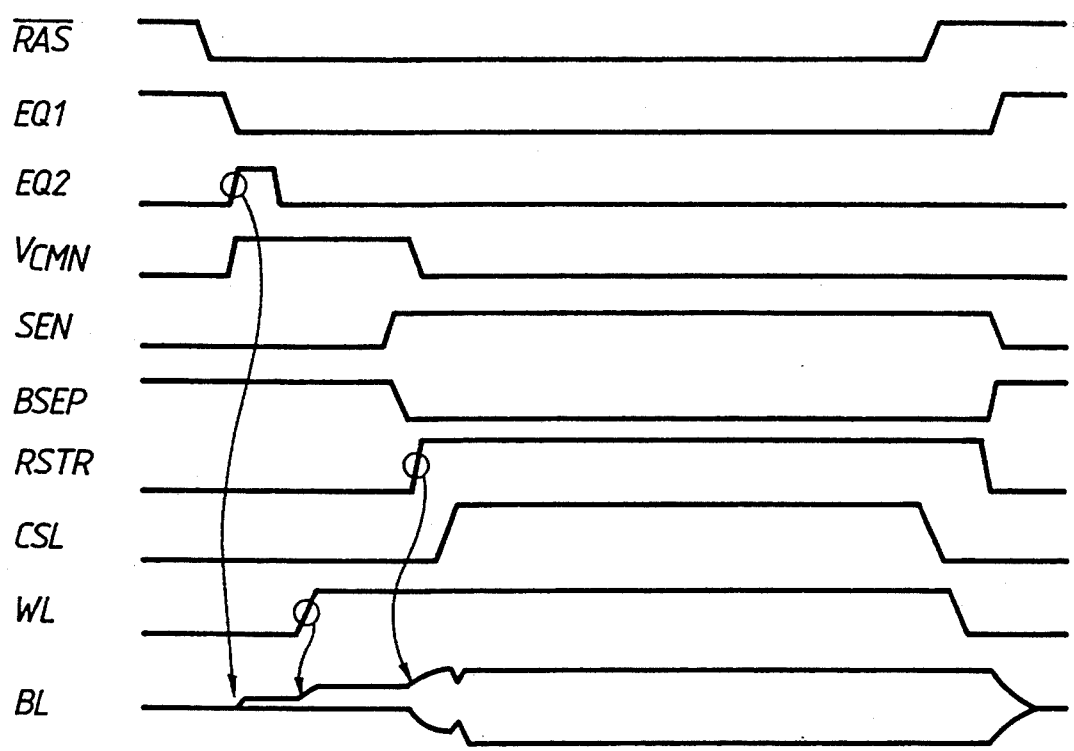
FIGS. 18 and 20 show timing charts for the fourth and fifth modifications.

FIG. 18 shows a timing chart according to the fourth modification of the first embodiment. In the modification, after the offset compensation by the signal EQ2 is carried out and the signal of WL is set to "H" level, data of a pair of bit lines BL,/BL is amplified by sense amplifier 50 and then sense amplifier 54 is made active by active signal SEN. BSEP and output terminals OUT,/OUT are at a maximum amplitude. Restore signal RSTR is set to "H" level, a voltage of output terminals OUT,/OUT which was at maximum amplitude, is rewritten to the pair of bit lines. At approximately the same time as the signal RSTR is set to "H" level, the data is transferred to DQ line by raising CSL.

In the fourth modification of FIG. 17, data which has been amplified by differential sense amplifier 50, is sensed, full-amplified and restored by flip-flop type sense amplifier 54. Therefore, a larger margin for operation can be obtained.

Figure 19:
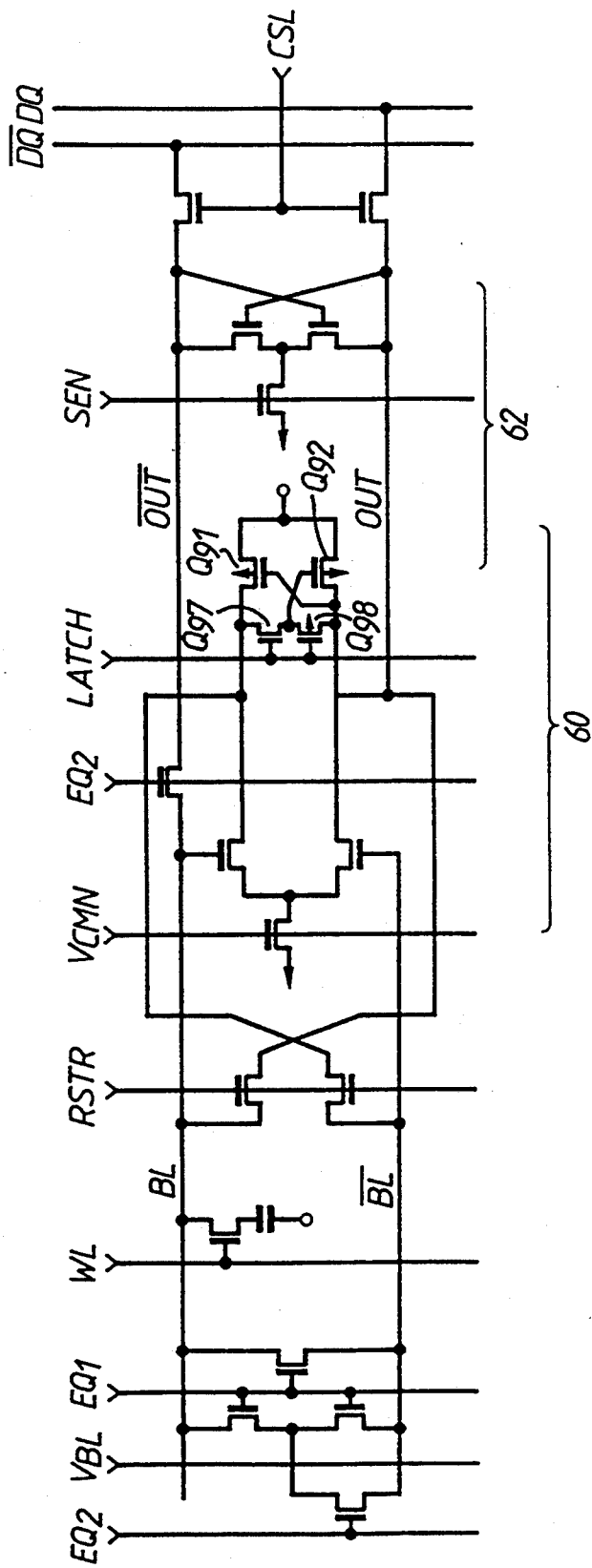

FIG. 19 shows a schematic circuit diagram of a fifth modification of the first embodiment. In the modification, PMOS transistors Q91, Q92 are shared so as to be used as a load against a differential sense amplifier 60 and PMOS transistors Q91, Q92 of a flip-flop type sense amplifier 62. An NMOS transistor Q97 and a PMOS transistor Q98, those which are controlled by an external control signal LATCH, are provided.

That is, when the control signal LATCH is "L" level, NMOS transistor Q97 is set to be off and PMOS transistor Q98 is set to be on. Accordingly, PMOS transistors Q91, Q92 are subject to be an active load for sense amplifier 60, e.g., a current mirror type sense amplifier. When the control signal LATCH is "H" level, PMOS transistors Q91, Q92 act as a PMOS flip-flop circuit, provided between output terminals OUT,/OUT.

Figure 20:
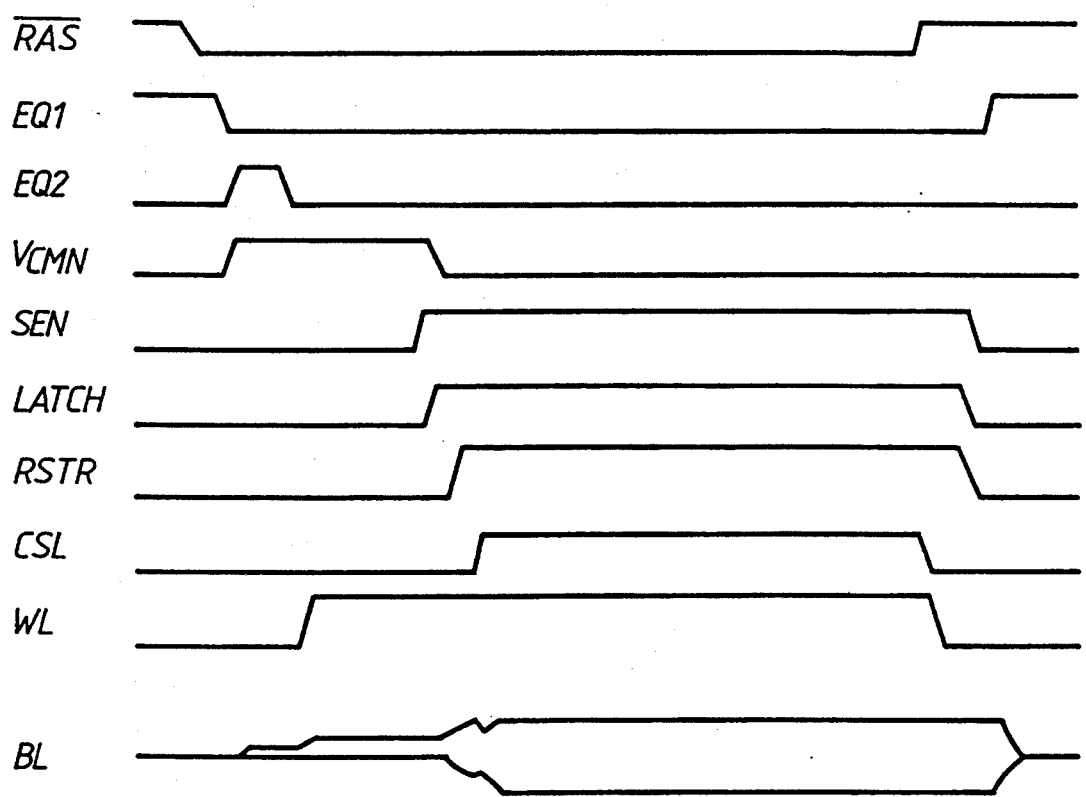

FIG. 20 shows a timing chart for the fifth modification of the first embodiment. After an activation signal SEN of flip-flop type sense amplifier is set up to "H" level and the control signal LATCH is also set to "H" level, then the bit line signal is amplified. According to this, PMOS flip-flop is set to maximum amplitude on output terminals OUT,/OUT. After this, restore signal RSTR is rise up and the signal full amplified is written to a pair of bit lines.

Figure 21:
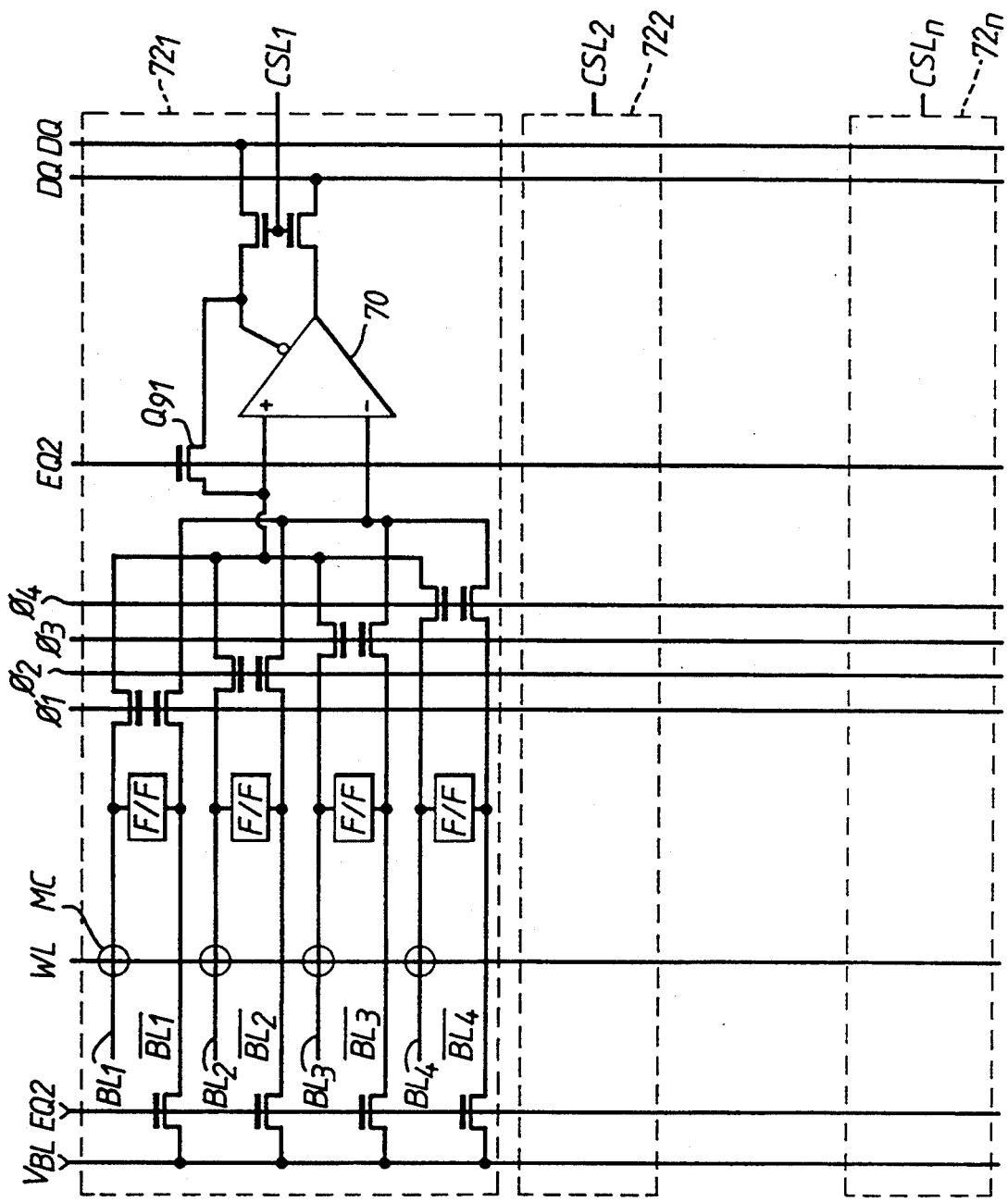
FIGS. 21 and 22 show a diagram and a timing chart, respectively, explaining a second embodiment.

FIG. 21 shows a schematic diagram of a second embodiment according to the invention. In this embodiment, four pairs of bit lines BL1,/BL1, BL2,/BL2, BL3,/BL3, BL4,/BL4 share one sense amplifier 70.

In the figure, an equalizing circuit is abbreviated. Transfer gate circuits are controlled by signals φ1, φ2, φ3 and φ4, such that a pair of bit lines among four pairs of bit lines in each blocks $72_1$, $72_2$, ... $72_n$ is selectively connected to sense amplifier 70.

Figure 22:
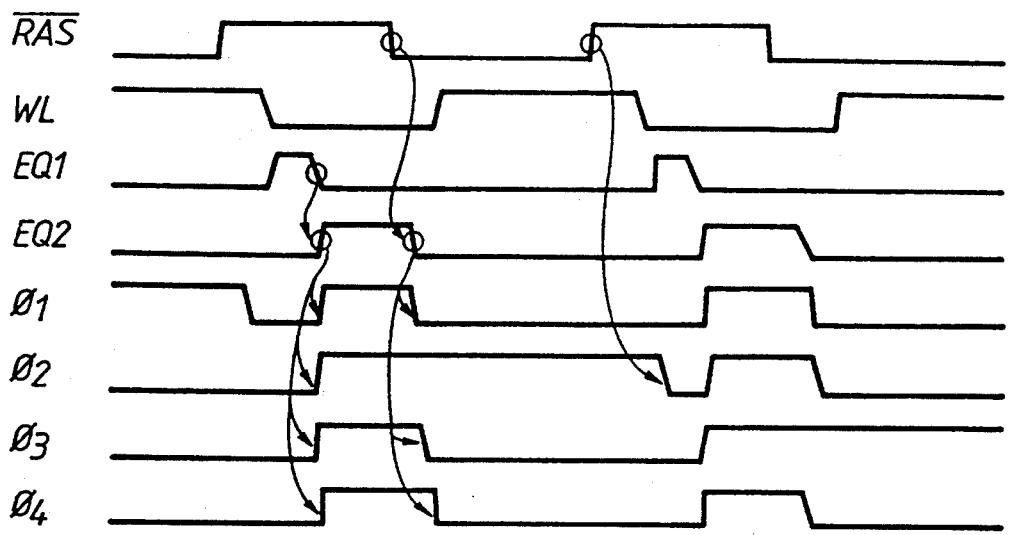

FIG. 22 shows a timing chart for the second embodiment of FIG. 21. Signals φ1 through φ4 are selective signals input to four pairs of bit lines as shown in FIG. 21. During an offset compensation operation, these signals are set to "H" level so that all bit lines are subject to a common level of voltage. In an active operation, one selected signal among the signals φ1 through φ4 is selected by an external selection circuit (not shown) and is set to "H" level and data from the selected bit lines is read out.

In the second embodiment of FIG. 21, sense amplifier 70 has a simple layout, even if a pitch of bit lines is to be very small. In the second embodiment, a sense amplifier 70 is shared among four pairs of bit lines, but sense amplifier 70 could also be shared among two pairs of bit lines or eight pairs of bit lines or any other reasonable number of pairs of bit lines.

Figure 23A:
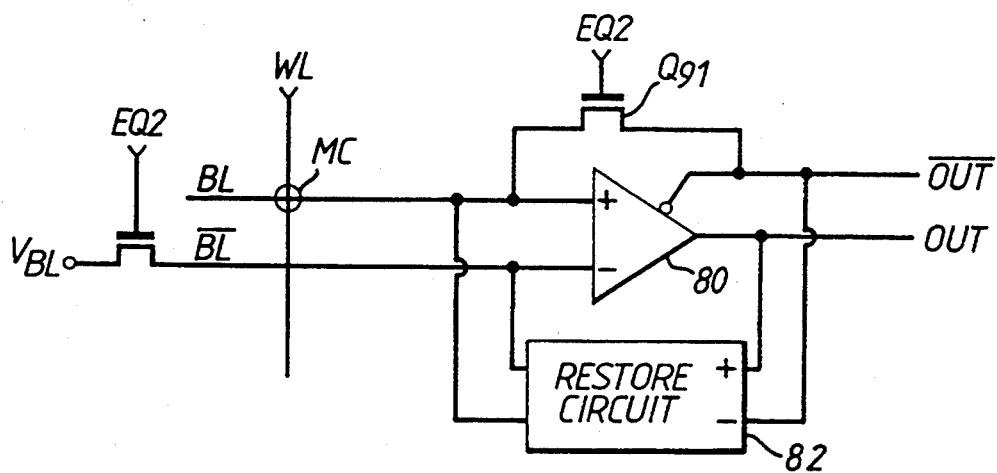
FIG. 23(a) shows a schematic circuit diagram.
Figure 23B:
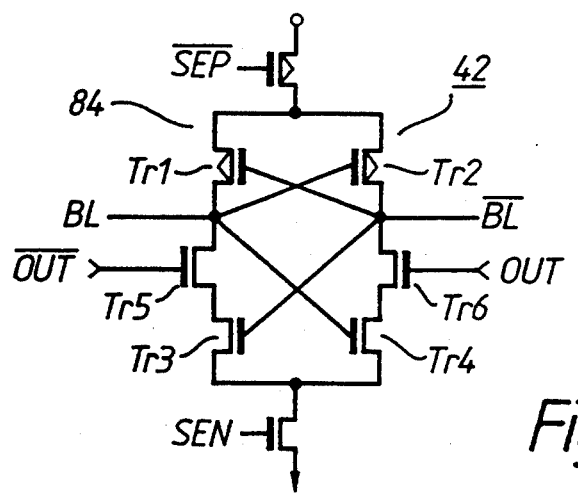
FIG. 23(b) shows a detailed example of a restore circuit.

FIG. 23(a) is a schematic circuit diagram of a third embodiment of the invention. In the first and second embodiments, a conventional flip-flop circuit is used as a restore circuit for the bit lines. In the third embodiment, a restore circuit 82 receives output OUT from a sense amplifier 80 and rewrites data into a pair of bit lines. FIG. 23(b) shows a detailed example of restore circuit 82. Restore circuit 82 comprises a clocked CMOS flip-flop 84 having two PMOS transistors $Tr_1$, $Tr_2$ and two NMOS transistors $Tr_3$, $Tr_4$. Two NMOS transistors $Tr_5$, $Tr_6$ are positioned between the PMOS transistor $TR_1$, $TR_2$, and NMOS transistor $TR_3$, $TR_4$ of the flip-flop 84 and are being controlled by signals OUT,/OUT.

Figure 24:
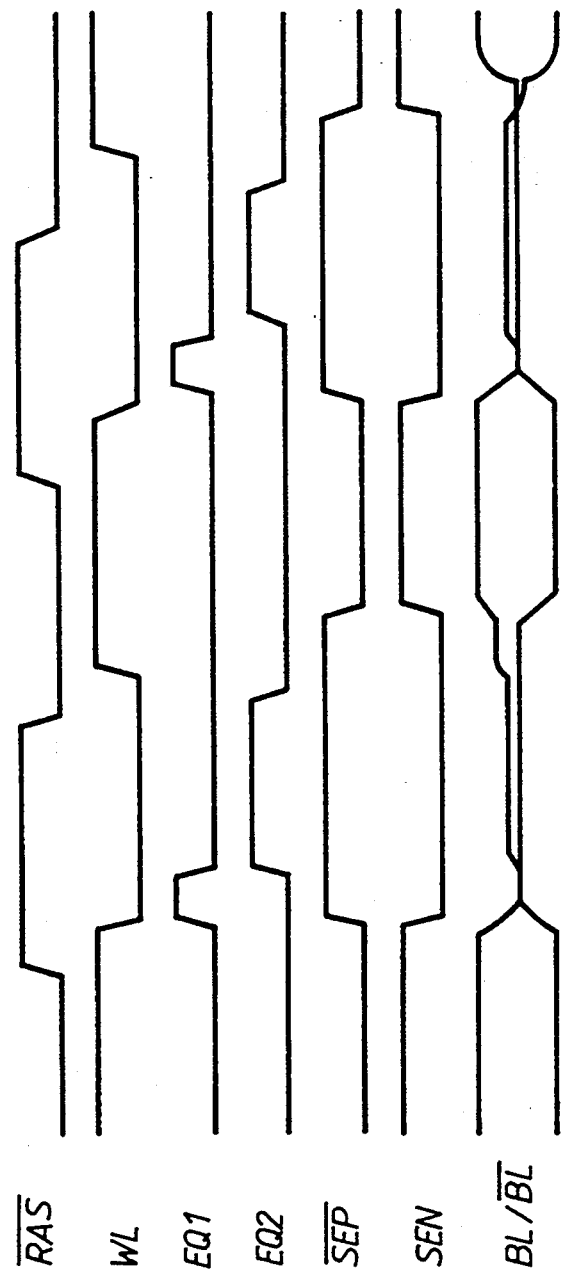
FIG. 24 shows a timing chart, all explaining a third embodiment.

FIG. 24 shows a timing chart for the third embodiment. As shown in the timing chart, data rewritten by restore circuit 82 is determined by outputs OUT,/OUT from the sense amplifier 80. Therefore, error data cannot be rewritten by a difference of precharge levels among a pair of bit lines or by an imbalance of the restore circuit itself, and a larger margin for operation can be obtained.

Numerous modifications and variations of the present invention are possible in light of the above teachings. It is therefore to be understood that, within the scope of the appended claims, the present invention can be practiced in a manner other than as specifically described herein.

What is claimed is:

1. A dynamic random access memory, which comprises:
   a substrate;
   a dynamic memory cell located on the substrate;
   a pair of bit lines to read out data from the cell and/or write data to the cell;
   a word line, coupled to the bit lines, to select a desired memory cell;
   a differential sense amplifier having an output line, the differential sense amplifier amplifying data from the pair of bit lines and transferring the amplified data to the output line;
   means for precharging a first bit line of the pair of bit lines to a reference voltage and a second bit line of the pair of bit lines to a second voltage exceeding the reference voltage by the amount of an input offset voltage of the sense amplifier.

2. A dynamic random access memory according to claim 1, wherein the precharging means includes a first transistor through which the first bit line is connected to a ½ Vcc generator.

3. A dynamic random access memory according to claim 2, wherein the precharging means further includes a second transistor connected between the output line and the second bit line, and the second voltage is fed back from one of the output lines and applied to the second bit line, through the second transistor.

4. A dynamic random access memory, according to claim 1, wherein the sense amplifier comprises two current mirror type differential sense amplifiers, parallel connected to each other.

5. A dynamic random access memory, according to claim 1, wherein the sense amplifier comprises two current mirror type differential sense amplifiers, directly connected to each other.

6. A dynamic random access memory according to claim 2, wherein the second bit line is connected to the ½ Vcc generator through a second transistor and wherein the first and second bit lines are connected to each other by a third transistor, and wherein the first, second, and third transistors form a precharge/equalize circuit.

7. A dynamic random access memory according to claim 6, wherein a fourth transistor is provided between one of the output lines and the second bit line, and the second voltage fed back from one of output lines is applied to the second bit line, through the fourth transistor.

8. A dynamic random access memory according to claim 7, further comprising means for controlling the reference voltage to a center of voltage amplitude of the output from the sense amplifier.

9. A dynamic random access memory according to claim 7, further comprising a fifth transistor provided between another output line and the first bit line.

10. A dynamic random access memory, according to claim 1, wherein the differential sense amplifier is shared by at least two pairs of bit lines.

11. A dynamic random access memory, according to claim 1, further comprising a restore circuit to rewrite data to the pair of bit lines.

12. A dynamic random access memory, comprising:
    a substrate;
    a dynamic memory cell located on the substrate;
    a pair of bit lines connected to the dynamic memory cell;
    a differential sense amplifier connected to the pair of bit lines for amplifying data on the bit lines and outputting the amplified data on an output line of the differential sense amplifier;
    means for precharging one of said bit lines to a first voltage and another of said bit lines to a second voltage; and
    means for feeding back the output of the differential sense amplifier to one of the bit lines during the precharging.

13. The memory of claim 12 further including restoring means connected between the pair of bit lines.

14. The memory of claim 13 wherein the restoring means includes a flip-flop connected between the pair of bit lines.

15. A dynamic random access memory, comprising:
    a substrate;
    a dynamic memory cell on the substrate;
    a pair of bit lines connected to one of the plurality of dynamic memory cells;
    a differential sense amplifier, connected to the pair of bit lines, for amplifying data on the bit lines and outputting the amplified data on each of two output lines of the differential sense amplifier;
    means for precharging one of said bit lines to a first voltage and another of said bit lines to a second voltage; and
    means for feeding back a first output of the differential sense amplifier to a first one of the pair of bit lines and for feeding back a second output of the differential sense amplifier to a second one of the pair of bit lines during the precharging.

16. The memory of claim 15, further including a restore circuit between the outputs of the differential sense amplifier and the bit lines.

17. The memory of claim 16, wherein the restoring means includes a CMOS flip-flip and two NMOS transistors.

18. A dynamic random access memory, comprising:
a substrate;
a plurality of dynamic memory cells on the substrate;
a plurality of pairs of bit lines, connected to the plurality of dynamic memory cells;
a differential sense amplifier, connected to at least two pairs of the plurality of pairs of bit lines, for amplifying data on the bit lines and outputting the amplified data on each of two output lines of the differential sense amplifier;
means for precharging one of said bit lines to a first voltage and another of said bit lines to a second voltage; and
means for feeding back the output of the differential sense amplifier to one of the bit lines in at least the two pairs of bit lines during the precharging.

19. A dynamic random access memory according to claim 12, wherein said feedback output is a negative feedback.

20. A dynamic random access memory according to claim 15, wherein said feedback output is a negative feedback.

21. A dynamic random access memory according to claim 18, wherein said feedback output is a negative feedback.

* * * * *